United States Patent
Sakai

(10) Patent No.: US 8,180,072 B2
(45) Date of Patent: May 15, 2012

(54) ELECTRONIC VOLUME DEVICE

(75) Inventor: Mitsuteru Sakai, Kyoto (JP)

(73) Assignee: Rohm Co., Ltd. (JP)

( * ) Notice: Subject to any disclaimer, the term of this patent is extended or adjusted under 35 U.S.C. 154(b) by 858 days.

(21) Appl. No.: 12/206,120

(22) Filed: Sep. 8, 2008

(65) Prior Publication Data

US 2009/0067645 A1    Mar. 12, 2009

(30) Foreign Application Priority Data

Sep. 7, 2007    (JP) ................. 2007-233196

(51) Int. Cl.
*H03G 3/00*    (2006.01)
(52) U.S. Cl. ........................ 381/104; 381/120
(58) Field of Classification Search .......... 381/106–109, 381/101, 102, 98, 77, 80, 119, 120, 1, 17, 381/55, 56, 300, 309, 58, 59; 330/250, 278, 330/284
See application file for complete search history.

(56) References Cited

U.S. PATENT DOCUMENTS 4,306,115 A * 12/1981 Humphrey .................. 381/107
5,450,624 A * 9/1995 Porambo et al. ........... 455/226.4

FOREIGN PATENT DOCUMENTS

| JP | 55-135512 U | 9/1980 |
| JP | 2003-304123 A | 10/2003 |
| JP | 2004-320273 | * 11/2004 |
| JP | 2005-117489 | 4/2005 |
| JP | 2005-217710 | 8/2005 |

OTHER PUBLICATIONS

Notice of Reason(s) for Refusal for Japanese Patent Application No. 2007-233196, mailed Feb. 28, 2012, with English translation.

* cited by examiner

*Primary Examiner* — Xu Mei
*Assistant Examiner* — Lun-See Lao
(74) *Attorney, Agent, or Firm* — Cantor Colburn LLP

(57) ABSTRACT

Amplifiers amplify input first audio signals according to volume values set beforehand. Via output terminals, the amplifiers output second audio signals to externally connected power amplifiers. A comparison unit compares the second audio signals with a reference signal. Via the detection terminals, detection signals are output externally according to the comparison results obtained by the comparison unit.

5 Claims, 2 Drawing Sheets

ELECTRONIC VOLUME DEVICE

BACKGROUND OF THE INVENTION

1. Field of the Invention

The present invention relates to an electronic volume device which controls the sound volume of an audio signal, etc.

2. Description of the Related Art

In general, electronic apparatuses having a function of playing back audio signals, such as CD players, audio amplifiers, car stereo systems, portable radios, portable audio players, etc., include a volume device which allows the sound volume to be adjusted, an equalizer which allows the frequency characteristics to be adjusted, etc. The volume device and the equalizer can be controlled by adjusting the amplitude of the audio signal.

The audio signal is amplified by an amplifier. In the final stage, the audio signal is output as sound via a speaker or headphones provided as an audio output unit. The volume adjustment is attained by controlling the gain of the amplifier or controlling the attenuation factor of an attenuator. For example, electronic volume circuits are disclosed in Patent documents 1 and 2, which allow the gain of an amplifier or the attenuation factor of an attenuator to be adjusted by switching the resistance of a variable resistor.

Furthermore, a final-stage amplifier (which will be referred to as a "power amplifier"), which provides sufficient driving force for driving an electro-acoustic conversion device such as a speaker, headphones, or the like, is provided downstream of the electronic volume circuit. In a case in which an offset (DC offset) occurs in the bias level of the power amplifier, a DC current continuously flows through the speaker. In some cases, this leads to reduced reliability. In order to solve this problem, whether or not such a DC offset has occurred is detected by making a comparison between the output of the power amplifier and a predetermined threshold.

In order to prevent false detection in the playback mode, a technique has been proposed in which the input level of the power amplifier is detected, and the input level thus detected is used as a feedback signal for adjusting a predetermined threshold (Patent document 3).

[Patent Document 1]
  Japanese Patent Application Laid Open No. 2005-117489
[Patent Document 2]
  Japanese Patent Application Laid Open No. 2005-217710
[Patent Document 3]
  Japanese Patent Application Laid Open No. 2004-320273

However, with the technique disclosed in Patent document 3, the level of the input signal of the power amplifier is subjected to AD conversion so as to determine the threshold value with reference to a lookup table. Such an arrangement has a problem of enlarging the scale of the circuit.

SUMMARY OF THE INVENTION

The present invention has been made in view of such a problem. Accordingly, it is a general purpose of the present invention to provide an electronic volume device which allows an abnormal state of the circuit to be detected in a simple manner.

An embodiment of the present invention relates to an electronic volume device. The electronic volume device comprises: an amplifier which amplifies an input first audio signal according to a given volume value; an output terminal via which a second audio signal output from the amplifier is output to an externally connected power amplifier; a comparator which compares the second audio signal output from the amplifier with a reference signal; and a detection terminal via which a detection signal generated according to the comparison result of the comparator is output externally.

With such an embodiment, determination is made in the electronic volume device with respect to the input level of the power amplifier, and the logical level of the detection signal is used as a reference, in addition to the result of the offset detection performed at the power amplifier provided downstream of the electronic volume device. Such an embodiment detects whether or not an abnormal state has occurred in the circuit in a simple manner, even in the playback operation, without involving a feedback control operation.

An electronic volume device according to the embodiment may further include a phase adjustment unit which is provided upstream of the comparator, and which shifts the phase of the second audio signal output from the amplifier and the phase of the reference signal.

In some cases, a coupling capacitor is provided between the electronic volume device and the power amplifier provided downstream thereof. Such an arrangement compensates for the phase shift due to the coupling capacitor, thereby matching the timing of the level detection for the power amplifier side and the timing of the level detection for the electronic volume device.

With regard to an electronic volume device according to the embodiment, the amplifier, the output terminal, and the detection terminal may be provided for each channel. Also, the electronic volume device may further include a mixer which receives the second audio signals output from the amplifiers provided in increments of channels, and which mixes the second audio signals, and which outputs the signal thus mixed. Also, the comparator may use the output signal of the mixer as the reference signal, may compare the second audio signal output from the amplifier for each channel with the output signal of the mixer, and may output a detection signal for each channel.

With such an arrangement, the reference signal is generated by mixing the signals output from the respective channels. Such an arrangement provides the reference level in the form of an AC signal generated based upon the audio waveform, thereby providing level determination in a more sure manner.

Also, the mixer may be capable of selecting the channels to be mixed.

The electronic volume device may preferably be monolithically integrated on a single semiconductor substrate. Examples of "arrangements monolithically integrated" include: an arrangement in which all the components of a circuit are formed on a semiconductor substrate; and an arrangement in which principal components of a circuit are integrally formed. Also, a part of the resistors, capacitors, and so forth, for adjusting circuit constants, may be provided in the form of components external to the semiconductor substrate.

Another embodiment of the present invention relates to an audio apparatus. The audio apparatus comprises: a sound source which plays back an audio signal; the above-described electronic volume device which amplifies a first audio signal, which is output from the sound source, according to a given volume value; a power amplifier which amplifies a second audio signal thus amplified by the electronic volume device; an offset detection unit which compares a third audio signal, which is output from the power amplifier, with a second reference signal, and outputs an error signal according to comparison results; a coupling capacitor which connects the output terminal of the electronic volume device and the power amplifier; an audio output unit which is driven by the power amplifier; and a processor which detects whether or not an abnormal state has occurred in the apparatus, based upon the logical value of the detection signal output from the electronic volume device and the logical value of the error signal output from the offset detection unit.

With such an embodiment, the processor determines whether or not an abnormal state has occurred in the circuit based upon the logical levels of the error signal and the detection signal, thereby providing a detection circuit in a simple form.

Yet another embodiment of the present invention relates to an abnormal state detection method. The abnormal state detection method comprises: generating a second audio signal by amplifying an input first audio signal according to a given volume value; comparing the level of the second audio signal thus amplified with a first reference signal, and outputting a detection signal according to the comparison results; generating a third audio signal via a power amplifier by amplifying the second audio signal, so as to drive an electro-acoustic conversion device; comparing the third audio signal with a second reference signal, and outputting an error signal according to the comparison results; and detecting whether or not an abnormal state has occurred in a circuit based upon the logical levels of the detection signal and the error signal, and protecting the circuit in which, if an abnormal state is detected, a predetermined protection operation is executed.

Such an embodiment detects whether or not an abnormal state has occurred in the circuit in the playback operation in a simple manner without involving a feedback operation.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Figure 1:
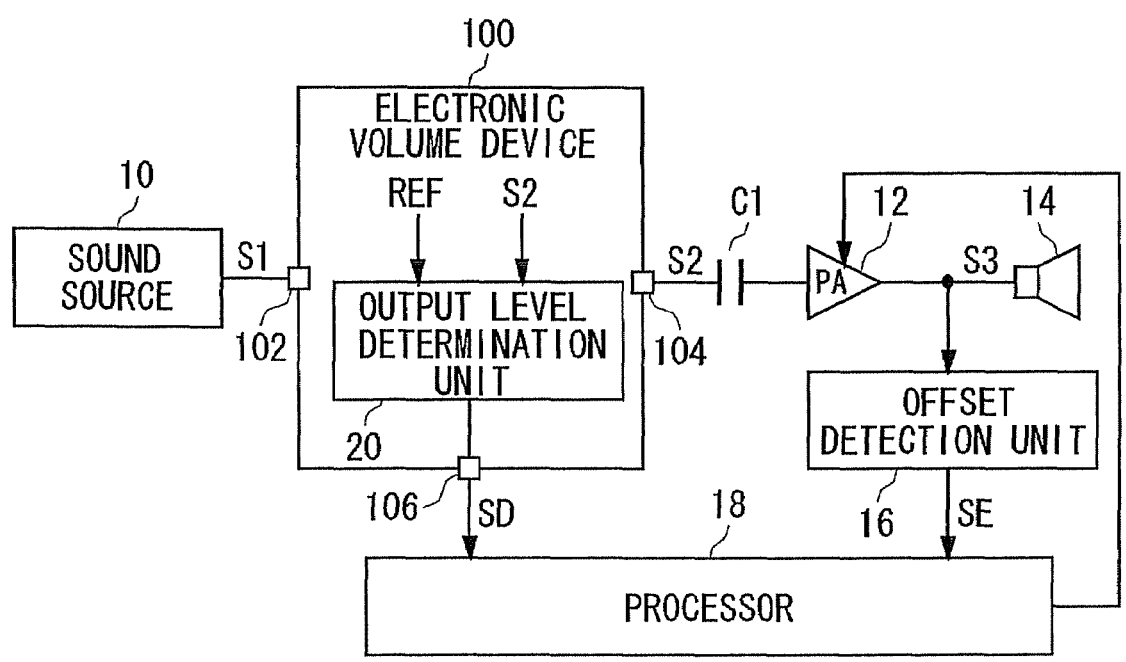
FIG. 1 is a block diagram which shows an overall configuration of an audio apparatus employing an electronic volume device according to an embodiment.

FIG. 1 is a block diagram which shows a configuration of an audio apparatus 1000 employing an electronic volume device 100 according to an embodiment. The audio apparatus 1000 is an apparatus including a means which outputs audio, such as an audio amplifier, a car stereo system, a portable audio player, a cellular phone terminal, or the like. The electronic volume device 100 according to the present embodiment is mounted on such an audio apparatus 1000, and provides a function of adjusting the volume of the sound to be output via an audio output unit such as a speaker, an earphone, or the like.

The audio apparatus 1000 includes the electronic volume device 100, a sound source 10, a power amplifier 12, an audio output unit 14, an offset detection unit 16, and a host processor 18. The sound source 10 is a block which converts the sound data, which is stored in disk media, memory, or a hard disk, or is input from an external source in a wired or wireless manner, into a first audio signal S1 in the form of an analog signal, and plays back the audio data thus converted.

The first audio signal S1 output from the sound source 10 is input to an input terminal 102 of the electronic volume device 100. The electronic volume device 100 amplifies the first audio signal S1 according to a volume value VOL set beforehand. The electronic volume device 100 includes an amplifier which amplifies or attenuates the first audio signal S1 as described later. The electronic volume device 100 changes the gain of the internal amplifier according to the volume value specified by the user. The electronic volume device 100 may be configured in the form of a part of a DSP (Digital Signal Processor) having an equalizing function, a mute function, etc.

The power amplifier 12 further amplifies the second audio signal S2 thus amplified by the electronic volume device 100. A coupling capacitor C1, which prevents DC current, is provided between an output terminal 104 of the electronic volume device 100 and the power amplifier 12. The audio output unit 14 is an electro-acoustic conversion device such as a speaker, an earphone, headphones, or the like. The audio output unit 14 is driven using the third audio signal S3 amplified by the power amplifier 12.

The offset detection unit 16 compares the third audio signal S3 output from the power amplifier 12 with a second reference signal, and outputs an error signal SE based upon the comparison results. For example, the offset detection unit 16 compares the third audio signal S3 with a second reference signal having a predetermined DC level. With such an arrangement, the offset detection unit 16 may be configured using a comparator which compares the third audio signal S3 with the second reference signal.

Also, the offset detection unit 16 may have a configuration including a filter which extracts the DC component of the third audio signal S3 and a comparator which compares the output of the filter with the second reference signal. It should be noted that the configuration of the offset detection unit 16 is not restricted to such arrangements. Rather, various kinds of known circuits may be used for the offset detection unit 16.

The electronic volume device 100 according to the embodiment includes an output level determination unit 20 which determines the level of the second audio signal S2 output from the output terminal 104. The output level determination unit 20 compares the second audio signal S2 with a reference signal by means of an output level determination function. Detailed description thereof will be made later. Furthermore, based upon the comparison results, the output level determination unit 20 outputs a detection signal SD which is used by the host processor 18 to detect whether or not an abnormal state has occurred.

The host processor 18 controls the overall operation of the audio apparatus 1000. The host processor 18 detects whether or not an abnormal state has occurred in the audio apparatus 1000 based upon the logical value of the detection signal SD output from the electronic volume device 100 and the logical value of the error signal SE output from the offset detection unit 16. In a case in which the host processor 18 has detected an abnormal state, the host processor 18 executes a predetermined protection operation. Examples of such protection operations include shutdown of the power amplifier 12, etc.

With the audio apparatus 1000 shown in FIG. 1, the electronic volume device 100 includes an output level determination function. With such an arrangement, the detection signal SD is output to the host processor 18 based upon the determination results, thereby detecting whether or not an abnormal state has occurred in the audio apparatus 1000 in a simple manner without involving a feedback function. It should be noted that FIG. 1 shows an arrangement including a single-channel component. Also, an arrangement may be made including a multi-channel component.

Figure 2:
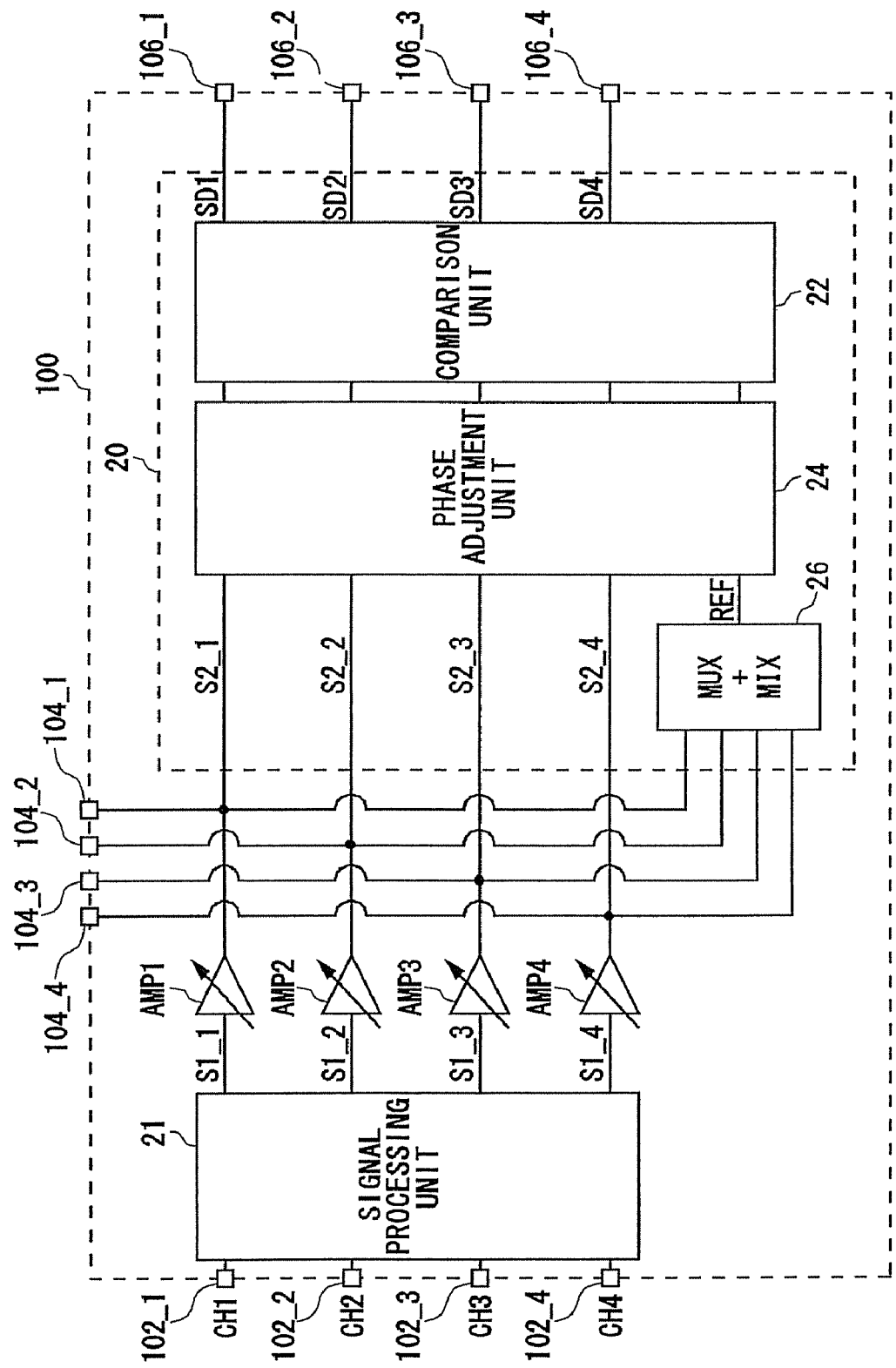
FIG. 2 is a block diagram which shows a configuration of the electronic volume device shown in FIG. 1.

FIG. 2 is a block diagram which shows a configuration of the electronic volume device 100 shown in FIG. 1. For example, in a case in which the electronic volume device 100 is employed in a car audio system, the electronic volume device 100 has a four-channel volume control function for adjusting the front-right channel, front-left channel, rear-left channel, and rear-right channel. The electronic volume device 100 includes a signal processing unit 21, amplifiers AMP1 through AMP4, and the output level determination unit 20.

The signal processing unit 21 performs predetermined signal processing on the first audio signal S1 input via the input terminal 102. The amplifiers AMP1 through AMP4 are provided in increments of channels. Each of the amplifiers AMP1 through AMP4 amplifies the first audio signal S1 of the corresponding channel, which has been input to the input terminal 102, according to the given volume value. The second audio signals S2_1 through S2_4, which are output from the respective amplifiers AMP1 through AMP4, are output to the externally connected power amplifier 12 via the respective output terminals 104_1 through 104_4, each of which is provided for a corresponding channel.

The output level determination unit 20 includes a comparison unit 22, a phase adjustment unit 24, and a mixer 26. The comparison unit 22 compares each of the second audio signals S2_1 through S2_4 output from the amplifiers AMP1 through AMP4 with a reference signal REF. The detection signals SD1 through SD4 are output externally via the detection terminals 106_1 through 106_4 according to the comparison results made by the comparison unit 22. That is to say, the comparison result between the second audio signal S2_i and the reference signal REF is output via the i'th (i is an integer from 1 to 4) channel detection terminal 106_i.

The phase adjustment unit 24 is provided upstream of the comparison unit 22. The phase adjustment unit 24 receives the second audio signals S2_1 through S2_4, which have been output from the amplifiers AMP1 through AMP4, and the reference signal REF. The phase adjustment unit 24 shifts the phases of the second audio signals S2_1 through S2_4 and the phase of the reference signal REF. The shift amount for the phase is set so as to compensate for the phase shift occurring due to the coupling capacitor C1 provided for each channel. It should be noted that, in a case in which there is no coupling capacitor C1 provided between the electronic volume device 100 and the power amplifier 12, the phase adjustment unit 24 can be eliminated.

The mixer 26 is provided in order to generate the reference signal REF. The mixer 26 receives the second audio signals S2_1 through S2_4 of the respective channels, and mixes these second audio signals. The signal thus mixed is output to the comparison unit 22 as the reference signal REF. The mixer 26 preferably has a function of selecting the channels to be mixed. With such an arrangement, the channels to be mixed are set according to an instruction from the host processor 18 shown in FIG. 1.

Instead of the signal thus generated by the mixer 26, the comparison unit 22 may use a DC signal, generated independently of the second audio signal S2, as the reference signal REF. Also, an arrangement may be made having a function of switching the reference signal REF to be used between the output signal of the mixer 26 and the DC signal according to an instruction from the host processor 18.

In a case in which the reference signal REF thus generated by the mixer 26 is used, the comparison unit 22 determines whether or not the level of the second audio signal S2 is within a predetermined range centering on the reference signal REF.

It should be noted that the proportion of the reference signal REF with respect to the full scale of the second audio signal S2 is set to a lower value than that of the second reference signal with respect to the full scale of the third audio signal S3. That is to say, the level determination executed by the output level determination unit 20 should be stricter than the offset detection by the offset detection unit 16.

Description will be made regarding the operations of the electronic volume device 100 and the audio apparatus 1000 thus configured.

The detection signal SD generated by the electronic volume device 100 indicates whether or not the amplitude level of the second audio signal S2 is greater than the reference level. Let us say that, in a case in which the amplitude of the second audio signal S2 is greater than the reference signal REF, the detection signal SD is set to the high-level state. On the other hand, in a case in which the amplitude of the second audio signal S2 is smaller than the reference signal REF, the detection signal SD is set to the low-level state.

Furthermore, the error signal SE generated by the offset detection unit 16 indicates whether or not the offset level of the third audio signal S3 is greater than a predetermined reference level. Let us say that, in a case in which the DC level (bias level) of the third audio signal S3 is greater than the second reference signal, i.e., in a case in which the offset is large, the error signal SE is set to the high-level state. On the other hand, in a case in which the offset is small, the error signal SE is set to the low-level state.

With such an arrangement, the electronic volume device 100 determines, based upon the logical values, whether or not an abnormal state has occurred in the circuit as follows.

(1) A case in which the detection signal SD is at the low level, and the error signal SE is at the high level.

In this case, the electronic volume device 100 determines that a DC offset has occurred in the power amplifier 12, and executes a predetermined protection operation. The reason is that the aforementioned state indicates that, although the power amplifier is receiving an input signal at a low level, a high level bias has occurred.

(2) A case in which the detection signal SD is at the low level, and the error signal SE is at the low level.

In this case, the electronic volume device 100 determines that no abnormal state has occurred.

(3) A case in which the detection signal SD is at the high level, and the error signal SE is at the high level.

In this case, the electronic volume device 100 determines that no abnormal state has occurred. The evaluation is that, in this state, the bias offset in the power amplifier has occurred due to the large amplitude of the signal input to the power amplifier. Accordingly, in this case, the electronic volume device 100 determines that no abnormal state has occurred.

(4) A case in which the detection signal SD is at the high level, and the error signal SE is at the low level.

In this case, the electronic volume device 100 determines that an abnormal state has occurred in the circuit. The reason is that, in this state, although the power amplifier is receiving an input signal at a high level, the power amplifier 12 outputs a small signal. In this case, it is suspected that there is a break in the connection between the power amplifier 12 and the electronic volume device 100, a malfunction of the power amplifier 12 has occurred, etc.

With the electronic volume device 100, determination is made whether or not an abnormal state has occurred in the circuit, based upon a combination of the logical values of the detection signal SD and the error signal SE. Such an arrangement requires no feedback control operation, thereby providing a simple circuit. Furthermore, such an arrangement includes the phase adjustment unit 24, thereby compensating for the phase shift due to the coupling capacitor. Moreover, such an arrangement includes the mixer 26. With such an arrangement, the reference signal REF is set to an AC signal generated based upon the audio waveform, thereby enabling level determination to be made in a sure manner.

The embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the scope of the present invention. Modifications may be made as described below for exemplary purposes.

Description has been made in the embodiment regarding an arrangement which provides a function of changing volume. However, the usage of the electronic volume device 100 is not restricted to such an arrangement. Also, the usage of the electronic volume device 100 may be used in an arrangement such as an equalizer which controls the gain in increments of frequency ranges. Also, although description has been made in the embodiment regarding an arrangement which provides a function of changing volume, the present invention may also be applied to muting processing for stopping playback processing.

While the preferred embodiments of the present invention have been described using specific terms, such description is for illustrative purposes only, and it is to be understood that changes and variations may be made without departing from the spirit or scope of the appended claims.

What is claimed is:

1. An electronic volume device comprising:
   an amplifier which amplifies an input first audio signal according to a given volume value;
   an output terminal via which a second audio signal output from the amplifier is output to an externally connected power amplifier;
   a comparator which compares the second audio signal output from the amplifier with a reference signal; and
   a detection terminal via which a detection signal generated according to the comparison result of the comparator is output externally,
   wherein the amplifier, the output terminal, and the detection terminal are provided for each channel,
   and the electronic volume device further comprises a mixer configured to receive the second audio signals output from the amplifiers provided in increments of channels, and to mix the second audio signals so as to generate the reference signal,
   and wherein the reference signal is an AC signal having a waveform based upon the second audio signals.

2. An electronic volume device according to claim 1, further including a phase adjustment unit which is provided upstream of the comparator, and which shifts the phase of the second audio signal output from the amplifier and the phase of the reference signal.

3. An electronic volume device according to claim 1, wherein the mixer is capable of selecting the channels to be mixed.

4. An audio apparatus comprising:
   a sound source which plays back an audio signal;
   an electronic volume device according to claim 1, which amplifies a first audio signal, which is output from the sound source, according to a given volume value;
   a power amplifier which amplifies a second audio signal thus amplified by the electronic volume device;
   an offset detection unit which compares a third audio signal, which is output from the power amplifier, with a second reference signal, and outputs an error signal according to comparison results;
   a coupling capacitor which connects the output terminal of the electronic volume device and the power amplifier;
   an audio output unit which is driven by the power amplifier; and
   a processor which detects whether or not an abnormal state has occurred in the apparatus, based upon the logical value of the detection signal output from the electronic volume device and the logical value of the error signal output from the offset detection unit.

5. An abnormal state detection method comprising:
   generating a second audio signal by amplifying an input first audio signal according to a given volume value;
   comparing the level of the second audio signal thus amplified with a first reference signal, and outputting a detection signal according to the comparison results;
   generating a third audio signal via a power amplifier by amplifying the second audio signal, so as to drive an electro-acoustic conversion device;
   comparing the third audio signal with a second reference signal, and outputting an error signal according to the comparison results;
   detecting whether or not an abnormal state has occurred in a circuit based upon the logical levels of the detection signal and the error signal, and protecting the circuit in which, if an abnormal state is detected, a predetermined protection operation is executed; and
   generating the first reference signal by mixing second audio signals output from a plurality of channels,
   wherein the reference signal is an AC signal having a waveform based upon the second audio signals.

* * * * *